(12) United States Patent
Liu et al.

(10) Patent No.: US 12,272,336 B2
(45) Date of Patent: *Apr. 8, 2025

(54) WIRELESS PROGRAMMABLE MEDIA PROCESSING SYSTEM

(71) Applicant: Microsoft Technology Licensing, LLC, Redmond, WA (US)

(72) Inventors: Yunxin Liu, Beijing (CN); Jiansong Zhang, Beijing (CN); Lintao Zhang, Beijing (CN); Thomas Moscibroda, Beijing (CN)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/389,926

(22) Filed: Dec. 20, 2023

(65) Prior Publication Data

US 2024/0212650 A1   Jun. 27, 2024

Related U.S. Application Data

(63) Continuation of application No. 17/986,683, filed on Nov. 14, 2022, now Pat. No. 11,893,963, which is a
(Continued)

(30) Foreign Application Priority Data

Aug. 25, 2017 (CN) .......................... 201710744954.7

(51) Int. Cl.
*G06T 9/00* (2006.01)
*G09G 5/36* (2006.01)

(52) U.S. Cl.
CPC ..... *G09G 5/363* (2013.01); *G09G 2320/0252* (2013.01); *G09G 2340/02* (2013.01);
(Continued)

(58) Field of Classification Search
CPC ........... G09G 2350/00; G09G 2340/02; G09G 2340/14; G09G 2370/16; G09G 5/363;
(Continued)

(56) References Cited

U.S. PATENT DOCUMENTS

| 10,171,825 B1* | 1/2019 | Jean ..................... H04N 19/436 |
| 2009/0002275 A1* | 1/2009 | Yamaguchi ........ H04N 21/4728 |
| | | 375/E7.181 |
| 2014/0078020 A1* | 3/2014 | Yamada ................ G06F 3/1454 |
| | | 345/1.1 |

OTHER PUBLICATIONS

EPO Notification R.70b(1) Received in European Patent Application No. 18749663.3, mailed on Oct. 8, 2020,1pages.

* cited by examiner

*Primary Examiner* — Hau H Nguyen
(74) *Attorney, Agent, or Firm* — Schwegman Lundberg & Woessner, P.A.

(57) ABSTRACT

Embodiments of the subject matter described herein relate to a wireless programmable media processing system. In the media processing system, a processing unit in a computing device generates a frame to be displayed based on a graphics content for an application running on the computing device. The frame to be displayed is then divided into a plurality of block groups which are compressed. The plurality of compressed block groups are sent to a graphics display device over a wireless link. In this manner, both the generation and the compression of the frame to be displayed may be completed at the same processing unit in the computing device, which avoids data copying and simplifies processing operations. Thereby, the data processing speed and efficiency is improved significantly.

20 Claims, 4 Drawing Sheets

Related U.S. Application Data continuation of application No. 16/635,628, filed as application No. PCT/US2018/040666 on Jul. 3, 2018, now Pat. No. 11,501,740.

(52) U.S. Cl.
CPC ..... *G09G 2352/00* (2013.01); *G09G 2360/06* (2013.01); *G09G 2360/12* (2013.01); *G09G 2370/06* (2013.01); *G09G 2370/16* (2013.01)

(58) Field of Classification Search
CPC ........ G06F 2212/401; H04N 21/43637; H04N 19/46; H04N 19/119; H04N 19/17; H04N 2201/33357; G06T 9/00
See application file for complete search history.

WIRELESS PROGRAMMABLE MEDIA PROCESSING SYSTEM

CROSS-REFERENCE TO RELATED APPLICATION

This application is a continuation application of U.S. patent application Ser. No. 17/986,683, filed Nov. 14, 2022, which is a continuation application of U.S. patent application Ser. No. 16/635,628, filed Jan. 31, 2020, which application is a U.S. National Stage Filing under 35 U.S.C. 371 of International Patent Application Serial No. PCT/US2018/040666, filed Jul. 3, 2018, and published as WO 2019/040187 A1 on Feb. 28, 2019, which claims priority to Chinese Application No. 201710744954.7 filed Aug. 25, 2017, which applications and publication are incorporated herein by reference in their entirety.

BACKGROUND

Virtual reality (VR) can simulate images, sounds and touches of the real world and create immersive virtual environments for users. In the context of the subject matter described herein, the VR may comprise augmented reality (AR). A VR system usually includes a computing device such as a personal computer (PC) and a graphics display device such as a head-mounted display (HMD). The graphics display device can provide high-quality VR experiences to a user by leveraging a computing device to render rich graphics contents at high frame rates and high visual quality.

Conventionally, the computing device and the graphics display device are typically connected via a cable. For example, the graphics display device may be connected to the computing device via a high-definition multimedia interface (HDMI) cable for receiving graphics contents from the computing device. The graphics display device may further send data such as sensor data to the computing device via a universal serial bus (USB) cable. However, those cables not only limit user mobility but also impose hazards to users, for example, might trip a user or wrap around the neck of the user.

SUMMARY

Unlike a conventional wireless media processing system that provides a wireless transmission interface between a computing device and a graphics display device, embodiments of the subject matter described herein provide a novel graphics processing flow to improve the processing efficiency and latency performance of a wireless media processing system.

According to the embodiments of the subject matter described herein, a frame to be displayed is generated at a processing unit in a computing device based on a graphics content for an application running on the computing device. The frame to be displayed is divided into a plurality of block groups which are compressed. Then, the plurality of compressed block groups are sent to a graphics display device over a wireless link. In this manner, rendering and compression associated with the graphics content is implemented at the same processing unit in the computing device, which greatly simplifies the processing flow at the computing device side and improves the efficiency.

It is to be understood that the Summary is not intended to identify key or essential features of implementations of the subject matter described herein, nor is it intended to be used to limit the scope of the subject matter described herein. Other features of the subject matter described herein will become easily comprehensible through the description below.

BRIEF DESCRIPTION OF THE DRAWINGS

Through the more detailed description in the accompanying drawings, the above and other features, advantages and aspects of the subject matter described herein will become more apparent. In the drawings, the same or similar reference numerals refer to the same or similar elements, where.

DETAILED DESCRIPTION

Figure 1:
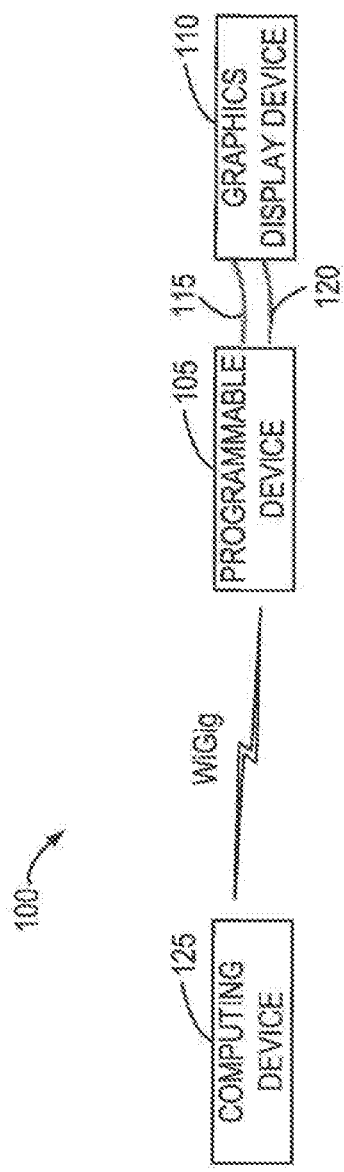
FIG. 1 shows an architecture of an example wireless programmable media processing system according to some embodiments of the subject matter described herein.

Embodiments of the subject matter described herein will be described in more detail with reference to the accompanying drawings, in which some embodiments of the subject matter described herein have been illustrated. However, the subject matter described herein can be implemented in various manners, and thus should not be construed to be limited to the embodiments disclosed herein. On the contrary, those embodiments are provided for the thorough and complete understanding of the subject matter described herein, and completely conveying the scope of the subject matter described herein to those skilled in the art. It should be understood that the accompanying drawings and embodiments of the subject matter described herein are merely for the illustration purpose, rather than limiting the protection scope of the subject matter described herein.

As used herein, the term "media processing system" refers to any suitable system with a high-definition or ultra high-definition media transmission capability. Examples of the media processing system include, but are not limited to, a VR system and an AR system. For the purpose of discussion, some embodiments will be described by taking the VR system as an example of the media processing system.

As used herein, the term "computing device" refers to any suitable device with a computing capability. The computing device may support any suitable application such as a VR or AR application and may process graphics contents used for the application so as to display the graphics contents on a graphics display device. Examples of the computing device include, but are not limited to, a mainframe, a server, a personal computer (PC), a desktop computer, a laptop computer, a notebook computer, a tablet computer, a netbook, a personal digital assistant (PDA), a mobile phone, or a smart phone. For the purpose of discussion, some embodiments will be described by taking the PC as an example of the computing device.

As used herein, the term "graphics display device" refers to any suitable device with a graphics display capability. The graphics display device may display graphics information that has been processed by the computing device, so as to provide VR experiences to users. Examples of the graphics display device include, but are not limited to, a desktop computer, a laptop computer, a notebook computer, a tablet computer, a netbook, PDA, a mobile phone, a smart phone, smart glasses, a smart watch, a personal communication system (PCS) device, an ebook device, a game device, or a head-mounted display (HMD). For the purpose of discussion, some embodiments will be described by taking the HMD is taken as an example of the graphics display device.

As used herein, the term "processing unit" may be any suitable physical or virtual processor that can perform various processing according to program code instructions. The processing unit may include one or more cores. In case that a plurality of cores are included, the plurality of cores may operate in parallel so that the processing efficiency of the processing unit is enhanced.

Examples of the processing unit include, but are not limited to, a central processing unit (CPU), a graphics processing unit (GPU), a field-programmable gate array (FPGA), an application-specific integrated circuit (ASIC), an application-specific standard product (ASSP), a system on chip (SoC), a complex programmable logic device (CPLD), and the like. For the purpose of discussion, some embodiments will be described by taking the GPU as an example of the processing unit.

As used herein, the term "include" and its variants used in embodiments of the subject matter described herein are to be read as open terms that mean "include, but is not limited to". The term "based on" is to be read as "based at least in part on". The terms "one embodiment" and "an implementation" are to be read as "at least one embodiment". The term "another embodiment" is to be read as "at least one other embodiment". Definitions of other terms will be presented in description below:

As described above, the computing device and the graphics display device in the VR system are conventionally connected via a cable, which not only limits user mobility but also might impose hazards to users. The use of wireless transmission instead of cable-based wired transmission has been explored to implement high-quality wireless VR systems. For example, the proprietary WirelessHD standard has been proposed, which enables wireless high-definition video transmission on frequencies of 60 GHz above. On the basis of the WirelessHD standard, a wireless HDMI interface over the frequencies of 60 GHZ above is implemented between the computing device and the graphics display device. Further, there has been proposed to replace a USB cable between the computing device and the graphics display device by wireless fidelity (Wi-Fi). Thereby, the cable is removed from the VR system, and further the above problems resulting from the wired transmission can be avoided.

However, inventors have noticed that the HDMI interface can only enable graphics contents of 2160×1200 pixels at a frame rate of 90 Hz and cannot meet requirements of high-quality VR applications on the system performance. In addition, the graphics display device of the wireless VR system only has display functionality but is not programmable, and thus has limited extensibility and flexibility. Further, it is impossible to leverage various software programming-based techniques to improve the performance.

To this end, in one aspect of embodiments of the subject matter described herein, the inventors have studied to discover and propose a wireless programmable media processing system. According to the media processing system proposed herein, in particular, a programmable device is added at the graphics display device side, so that the graphics display device is programmable. FIG. 1 shows an example wireless programmable media processing system 100 according to some embodiments of the subject matter described herein. In this example, the media processing system 100 is implemented as a VR system. However, it should be understood this is merely for the purpose of illustration, without suggesting any limitations on the scope of the subject matter described herein.

As shown, in the system 100, a programmable device 105 is arranged and coupled to a graphics display device 110 (HMD in this example) so as to provide programmability to the graphics display device 110. The programmable device 105 may be implemented in any suitable form. As an example, the programmable device 105 may include a portable and low-power system on chip (SoC) at the smart phone level. According to embodiments of the subject matter described herein, the programmable device 105 may include any suitable component(s), and an example in this regard will be described in the following paragraphs with reference to FIG. 2.

The coupling between the graphics display device 110 and the programmable device 105 may be implemented in any suitable manner. As an example, the programmable device 105 may connected with the graphics display device 110 via an HDMI cable 115 and a USB cable 120, so as to send frames related to an application (for example, the VR application) and to be displayed to the graphics display device 110 via the HDMI cable 115 and receive data such as sensor data from the graphics display device 110 via the USB cable 120. It should be understood that other coupling manners is also suitable.

In the system 100, data transmission is performed over a wireless link between the programmable device 105 and a computing device 125. For example, the programmable device 105 may receive graphics contents used for a specific application from the computing device 125 over a wireless link and send sensor data from the graphics display device 110 to the computing device 125. In this example, as shown in FIG. 1, the wireless link between the programmable device 110 and the computing device 125 enables Internet Protocol (IP)-based transmissions on the basis of the Wireless Gigabit (WiGig) Alliance standard. It should be understood that this is merely illustrative but not limited. Any wireless communication technology and communication protocol currently known or to be developed in the future are applicable. Examples of the communication technology include, but are not limited to, a wireless local area network (WLAN). Worldwide Interoperability for Microwave Access (WiMAX). Bluetooth. Zigbee technology, machine-type communication (MTC). D2D, or M2M, etc. Examples of the communication protocol include, but not limited to, the Transmission Control Protocol (TCP) or Internet Protocol (IP), the Hypertext Transfer Protocol (HTTP), the User Datagram Protocol (UDP), the Session Description Protocol (SDP), etc.

Since programmability is provided at the graphics display device side, the computing device and the graphics display device may work in collaboration on the basis of software programming, which improves extensibility and flexibility of the wireless media processing system. In addition, various software programming-based techniques such as compression algorithms, content prefetching, pose prediction and collaborative rendering may be used to increase the frame rate and resolution of the wireless media processing system, thereby improving the system performance and user experiences.

However, the system 100 might still face challenges from the transmission rate and processing latency. For example, future VR systems target at a very high frame rate (for example, 120 Hz) and resolution. As an example, high-end three-dimensional (3D) VR games impose very high requirements on network throughput and end-to-end system latency. Table 1 below shows required example data throughput in different display resolutions with a frame rate of 90 Hz.

TABLE 1

| Display resolution (pixels) | Raw data rate (Gbps) |
|---|---|
| 2048 × 1080 (2K) | 4.8 |
| 2160 × 1200 (HTC Vive) | 5.6 |
| 3840 × 2160 (4K UHD) | 17.9 |
| 7680 × 4320 (8K UHD) | 71.7 |

In this example, it is assumed that the RGB data of each pixel is encoded using three bytes. Without compression, the raw data rate required by a 2160×1200 display resolution is 5.6. In the cases of 4K ultra high-definition (UHD) and 8K UHD, the required data rates are even as high as 17.9 Gbps and 71.7 Gbps, respectively.

As for the system latency, in the case of a frame rate of 90 Hz, the VR system has to be able to render, transmit, and display a high-resolution frame every 11 ms, to ensure a smooth user experience. For the future VR targeting at a frame rate of 120 Hz, the frame period is even reduced to be only 8.3 ms. Furthermore, the high-quality VR also requires a total end-to-end (namely, motion-to-photon) latency of 20-25 ms. That is, once the graphics display device moves, the VR system has to be able to display in 20 ms to 25 ms a new frame generated from a new pose of the graphics display device.

In the case that the wired transmission is employed, a frame to be displayed and generated at the computing device side may be directly sent to the graphics display device via a cable (e.g., HDMI cable). Unlike this, the wireless transmission requires some extra processing, which will be described below with reference to FIG. 2.

Figure 2:
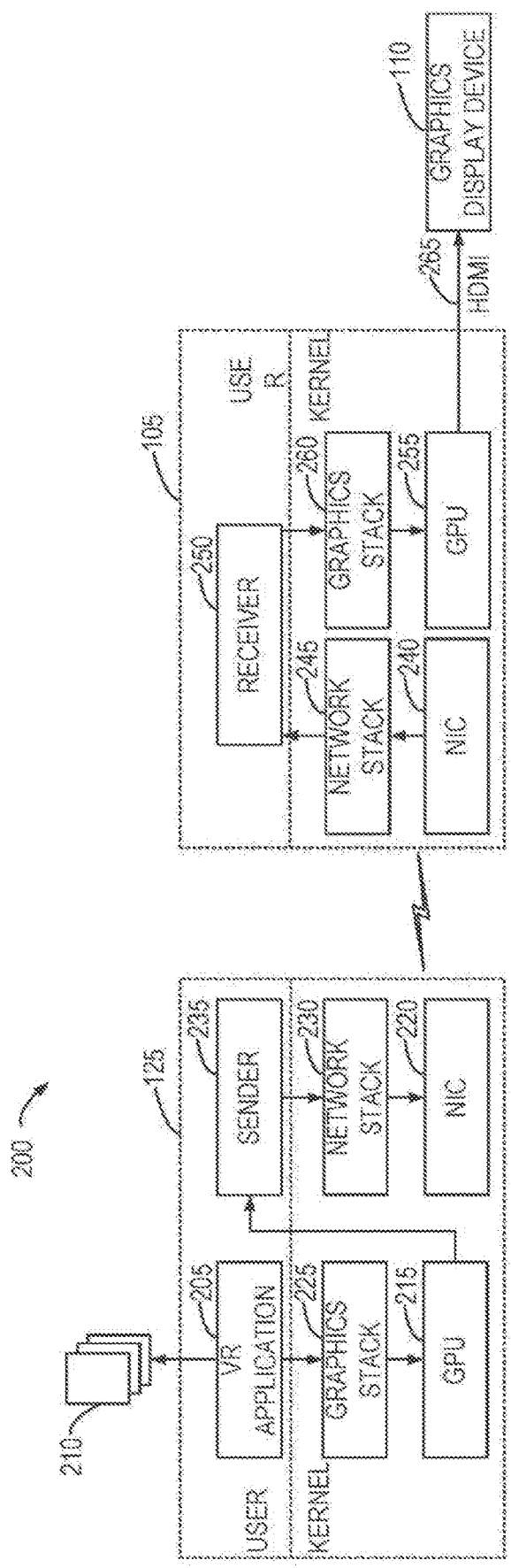
FIG. 2 shows an architecture of an example wireless programmable media processing system according to some other embodiments of the subject matter described herein.

FIG. 2 shows an architecture of an example wireless programmable media processing system 200 according to some other embodiments of the subject matter described herein. In this example, a VR system is taken as an example of the media processing system for the purpose of discussion. As shown in FIG. 2, in the system 200, the computing device 125 comprises an application (for example, the VR application) 205 running thereon, for providing corresponding services to the user, for example, displaying a graphics content 210. The computing device 125 further comprises a processing unit (referred to as "a first processing unit") 215 for performing operations such as rendering of the graphics content of the application 205. In this example, as shown in FIG. 2, the processing unit 215 is implemented by a GPU. However, this is merely illustrative but not limited. The processing unit 215 may be implemented as any suitable form. For example, the first processing unit 215 may further be implemented as an FPGA or ASIC.

In addition to the first processing unit 215, in some embodiments, the computing device 125 may further comprise one or more other suitable processing units. As an example, in the embodiment where the first processing unit 215 is implemented by a GPU or FPGA, the computing device 125 may further comprise a CPU. At this point, the GPU or FPGA is used for performing functions such as graphics rendering, and the CPU is used for performing a general processing function. A plurality of processing units may execute computer-executable instructions in parallel, so as to increase the parallel processing capability of the computing device 125.

As shown in FIG. 2, the computing device 125 further comprises a wireless network interface unit (referred to as "a first wireless network interface unit") 220 for providing an interface for wireless communication with the programmable device 105. As an example, as shown in this figure, the first wireless network interface unit 220 is implemented by a network interface card (NIC). Other implementation forms of the first wireless network interface unit 220 are also possible.

In addition, the computing device 125 may further comprise any other suitable communication interface for enabling communication with other external devices via a communication medium. Other external devices include, but are not limited to, a further computing device server, such as a storage device, a display device, an input device such as a mouse, keyboard, touchscreen, trackball, voice input device and the like, an output device such as a display, loudspeaker, printer and the like, or any middleware (for example, a network card, modem, and the like) for enabling the computing device 125 to communicate with other external devices.

In the system 200, the computing device 125 further comprises a graphics stack 225 and a network stack 230. The graphics stack 225 may be accessible to the first processing unit 215 to store a graphics content 210 to be processed. The network stack 230 and the first wireless network interface unit 220 cooperate with each other to store data to be transmitted over a wireless link. The graphics stack 225 and the network stack 230 each may be implemented by any suitable storage device such as computer-readable or machine-readable storage media. Such media may be any available media accessible to the computing device 125, including, but not limited to, volatile or nonvolatile media and removable or non-removable media. In addition to this, the computing device 125 may further comprise one or more other storage devices for storing other information and/or data accessible within the computing device 125.

As shown in FIG. 2, the computing device 125 further comprises a sending unit 235 for performing operations such as compression of a frame used for the application 205 to reduce the size of data to be transmitted over the wireless link. Detailed operations of the sending unit 235 will be described in the following paragraphs.

In addition to the components as shown, the computing device 125 may further comprise any other suitable component. For example, the computing device 125 may comprise a memory, which may be a volatile memory such as register, cache and random-access memory (RAM), non-volatile memory such as read-only memory (ROM), electrically erasable programmable read-only memory (EEPROM) and flash memory, or some combination thereof. The memory may comprise one or more program modules, which are configured to execute various functions implemented by the various embodiments of the subject matter described herein. In particular, the program modules may be accessible and run by the first processing unit 215 to perform the corresponding functions.

In this example, at the computing device 125 side, the application 205 traverses the boundary of a user mode and a kernel mode via VR software development kit (SDK) (not shown) and generates based on the associated graphics content 210 a frame to be displayed by using the first processor 215. The frame may be stored in a memory (not shown) of the first processing unit 215.

In the embodiment where the computing device 125 comprises a GPU as the first processing unit 215 and comprises a CPU for performing a general processing function, the sending unit 235 may traverse the boundary of the kernel mode and the user mode by using the system's graphics application programming interface (API) and extracts the frame to be displayed from the memory of the first processing unit 215 to a memory (not shown) of the CPU. The sending unit 235 may compress the frame to reduce the data size. Subsequently, the sending unit 235 re-traverses the boundary of the user mode and the kernel mode and sends the compressed data to the first wireless network interface unit 220 via the network stack 230. The first wireless network interface unit 220 sends the compressed data over the wireless link.

In the system 200, the data sent by the computing device 125 over the wireless link may be received by the programmable device 105. As shown in FIG. 2, the programmable device 105 comprises a wireless network interface unit (referred to as "a second wireless network interface unit") 240, a network stack 245 for storing a frame received by the second wireless network interface unit 240, a receiving unit 250 for decompressing the received frame, a processing unit (referred to as "a second processing unit") 255, and a graphics stack 260 for storing graphics contents which is accessible to the second processing unit 255. Functions and implementations of these components in the programmable device 105 are similar to those of the corresponding components in the computing device 125 described above and thus will not be detailed here. Similar to the computing device 125, the programmable device 105 may comprise any other suitable component in addition to these components mentioned above.

In the programmable device 105, the second wireless network interface unit (for example, NIC) 240 receives data from the computing device 125 over a wireless link and stores the data in the network stack 245. The receiver 250 traverses the boundary of the user mode and the kernel mode, obtains from the network stack 245 the data received by the second wireless network interface unit 240 and decompresses the data. Next, the receiver 250 delivers the decompressed frame to the second processing unit (for example, GPU) 255 across the above boundary again via the graphics stack 260. As shown in FIG. 2, the second processing unit 255 of the programmable device 105 is connected with the graphics display device 110 via a cable (for example, HDMI cable) 260, so that the decompressed frame may be delivered to the graphics display device 110 for display on the graphics display device 110.

As described above, in the system 200, all data processing operations of the graphics display device 110 can be executed on the programmable device 105. This makes the graphics display device 110 similar to a thin client end system. In this way, the extensibility and flexibility of the graphics display device 110 is enhanced.

The above data processing procedure involves multiple times of data copying and thereby generates many extra data copies. For example, in the computing device 125, the frame to be displayed possibly needs to be copied from the memory of the first processing unit 215 to a host memory and then copied from the sending unit 235 to the first wireless network interface unit 220. In the programmable device 105, the data needs to be copied from the second wireless network interface unit 240 to the receiver 250 and then to the second processing unit 255. With the data compression and decompression, the amount of data to be transmitted over the wireless link can be reduced significantly, and thereby the efficiency of data transmission is improved.

However, inventors have noticed that if there is large amount of data, the data copying, compressing and decompressing operations may increase the processing burden on the system. In order to further simplify the processing operation to increase the processing efficiency and reduce the processing latency, in another aspect of the embodiments of the subject matter described herein, inventors have further proposed a high-efficiency data compression and decompression scheme. According to embodiments of the subject matter described herein, a first processing unit in a computing device performs such operations as generating, compressing and sending a frame to be displayed. Specifically, the first processing unit generates a frame to be displayed based on a graphics content for an application running on the computing device. Then, the first processing unit divides the frame to be displayed into a plurality of block groups and compresses these block groups. Next, the first processing unit sends the plurality of compressed block groups to a graphics display device over a wireless link. Thereby, these generating, compressing and sending operations may be performed by the same processing unit at the sending end, so that the frequent data copying shown in FIG. 2 may be reduced and the processing latency is further decreased.

Accordingly, at the receiving end, operations regarding receiving and decompressing the graphics content may also be performed by the same processing unit, in particular, by a second processing unit in a programmable device coupled to the graphics display device. Specifically, the second processing unit receives, from the computing device over a wireless link, a plurality of compressed block groups which are generated based on a graphics content used for a specific application running on the computing device. Subsequently, the second processing unit decompresses the plurality of received block groups and generates a frame to be displayed based on the plurality of decompressed block groups so as to display the frame on the graphics display device. In this way, the frequent data copying is also avoided at the receiving end, and the processing latency is further decreased.

Figure 3:
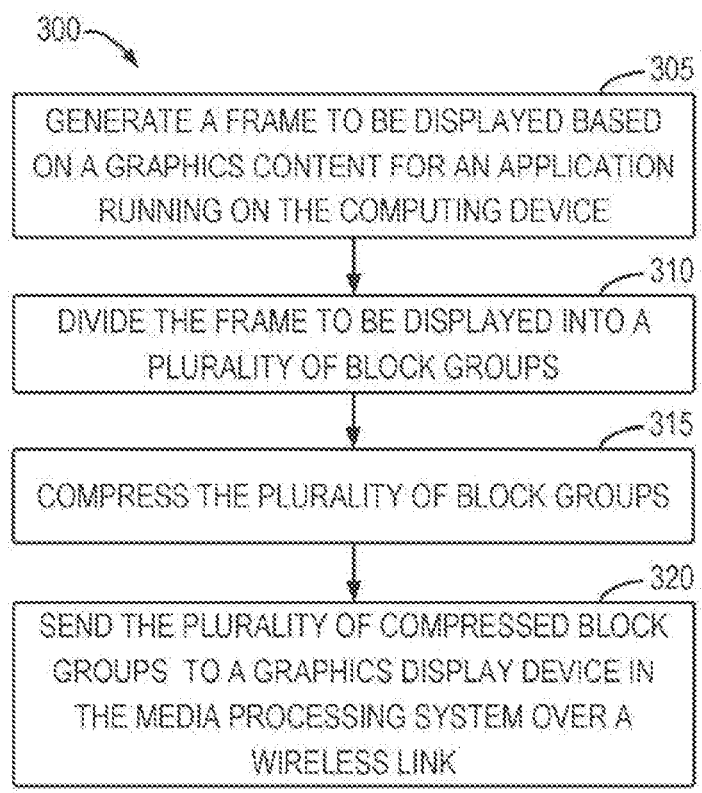
FIG. 3 shows a flowchart of a method according to some embodiments of the subject matter described herein.
Figure 4:
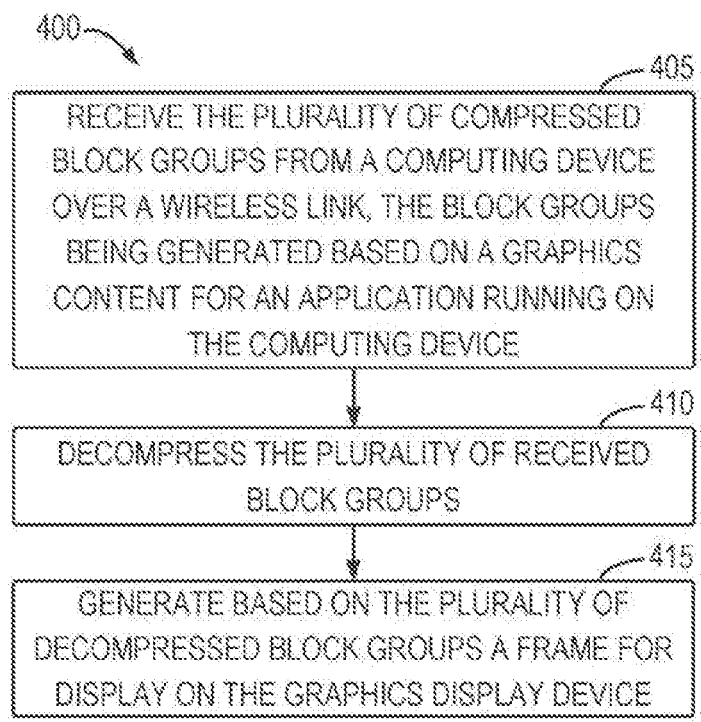
FIG. 4 shows a flowchart of a method according to some other embodiments of the subject matter described herein.

With reference to FIGS. 3 and 4, basic principles and several example implementations of the subject matter described herein in this regard will be described below. Referring to FIG. 3 first, there is shown a flowchart of a method 300 implemented at a first processing unit of a computing device according to some embodiments of the subject matter described herein. The method 300 can be implemented by the first processing unit 215 in the computing device 125 shown in FIG. 2. For the purpose of discussion, the method 300 will be described below with reference to FIG. 2.

As shown in FIG. 3, at block 305, the first processing unit 215 generates a frame to be displayed based on the graphics content 210 for the application 205 running on the computing device 125. As an example, the frame to be displayed may be generated by rendering the graphics content 210. Any rendering approach currently known or to be developed in the future is applicable.

After obtaining the frame to be displayed, the first processing unit 215 divides the obtained frame into a plurality of block groups at block 310 and compresses these block groups at block 315. According to embodiments of the subject matter described herein, the compression may be implemented by using any suitable compression algorithm. In particular, in some embodiments, the first processing unit 215 may compress the plurality of block groups in parallel so as to further improve the processing efficiency and reduce the latency. An example in this regard will be presented in the following paragraphs.

In the case where the first processing unit 215 comprises a plurality of cores, operations of the generation and compression of the frame to be displayed may be performed using the plurality of cores in parallel. That is, in some embodiments, blocks 305, 310 and 315 may be executed in parallel. For example, the first processing unit 215 may use one set of cores (referred to as "a first set of cores") among the plurality of cores to generate the frame to be displayed based on the graphics content 210 (referred to as "a first graphics content"). Concurrently, the first processing unit 215 uses a different set of cores (referred to as "a second set of cores") to compress the plurality of block groups obtained from the frame to be displayed. As such, while using the second set of cores for graphics compression, the first processing unit may simultaneously use the first set of cores to generate a frame to be displayed based on other graphics content (referred to as "a second graphics content") 30) used for the application, thereby significantly improving the system processing efficiency.

After compressing the plurality of block groups, at block 320, the first processing unit 215 sends the plurality of compressed block groups to the graphics display device 110 over a wireless link. Any wireless transmission scheme currently known or to be developed in the future is applicable here. The first processing unit 215 may enable the transmission of the plurality of block groups to the graphics display device in any suitable manner. In order to further improve the processing efficiency, in some embodiments, the first processing unit 215 may arrange parallel processing pipelines for compression and transmission. That is, blocks 315 and 320 may be executed concurrently. For example, the first processing unit 215 may execute a plurality of threads, use one thread (referred to as "a first thread") for compression and uses another different thread (referred to as "a second thread") for transmission.

As an example, after dividing the frame to be displayed into the plurality of block groups, the first processing unit 215 may use the first thread to compress block groups one after another. After completing the compression of one block group (referred to as "a first block group"), the first processing unit 215 may immediately use a separate second thread to send the block group over the wireless link. At the same time, the first processing unit 215 may continue to use the first thread to compress another block group (referred to as "a second block group"). Such parallel compression and transmission processing significantly shortens the processing time at the sending end.

Accordingly, at the receiving end, once a compressed block group is received, the group may be decompressed immediately, instead of waiting for all block groups to be received. This greatly shortens the total time of the end-to-end data processing. Detailed operations at the receiving end will be described in the following paragraphs with reference to FIG. 4.

In order to further shorten the data processing pipelines at the sending end so as to further reduce the latency, in some embodiments, the first processing unit 215 may be coupled to the first wireless network interface unit 220 in the computing device 125, to establish a direct data transmission path between them. The coupling may be implemented in any suitable manner. As an example, the first processing unit 215 and the first wireless network interface unit 220 may be connected to the same peripheral component interconnect express (PCIe) bus and then directly access a memory of each other via the PCIe protocol.

In this manner, the graphics data can be sent to the graphics display device from the computing device with no need to traverse the kernel/user mode boundary with multiple times of data copying. As an example, for the wireless system 200 shown in FIG. 2, after the first processing unit (for example, GPU) 215 divides the frame to be displayed into the plurality of block groups and compresses the respective block groups, the compressed block groups may be stored in the memory of the first processing unit 215, instead of being copied to the host memory. The first wireless network interface unit (for example, NIC) 220 may be allowed to directly access the memory of the first processing unit 215, so that the compressed block groups may be directly sent out over the wireless link bypass the host memory. In this manner, the length of the data path at the sending end is further shortened, thereby further improving the system performance and reducing the system latency.

Accordingly, a high-efficiency data compression method may be used to further reduce the processing latency at the receiving end. Detailed operations at the receiving side will be described below with reference to FIG. 4. FIG. 4 shows a flowchart of a method 400 implemented at a second processing unit in a programmable device coupled to the graphics display device according to some embodiments of the subject matter described herein. The method 400 can be implemented by the second processing unit 255 in the programmable device 105 shown in FIG. 2. For the purpose of discussion, the method 400 will be described with reference to FIG. 2.

As shown in FIG. 4, at block 405, the second processing unit 255 receives, from the computing device 125 over the wireless link, the plurality of compressed block groups which are generated based on the graphics content 210 for the application 205 running on the computing device 125. The second processing unit 255 may implement the receiving in any suitable manner. In order shorten the data transmission path at the receiving end and further simplify the operations at the receiving end, in some embodiments, the second processing unit 255 may be coupled to the second wireless network interface unit 240 in the programmable device 105 so as to establish a direct data transmission path. In this case, the second processing unit 255 may receive the plurality of compressed block groups from the computing device 125 via the second wireless network interface unit 240 over the wireless link. The implementations of the coupling between the second processing unit 255 and the second wireless network interface unit 220 is similar to that of the coupling between the first processing unit 215 and the second wireless network interface unit 240 and thereby will not be detailed here.

At block 410, the second processing unit 255 decompresses the received block groups. Any decompression approach currently known or to be developed in the future is applicable here. In particular, as described above, in the embodiments where the plurality 30) of block groups are received and decompressed in parallel at the sending end, the second processing unit 255 may receive and decompress the plurality of block groups in parallel. That is, blocks 405 and 410 may be executed in parallel. For example, the second processing unit 255 may execute a plurality of threads, use one thread (referred to as "a third thread") to receive one block group (referred to as "a third block group"), and use another different thread (referred to as "a fourth thread") to decompress the received block group. Thereby, while decompressing the received block group, the second processing unit 255 may use the third thread to receive another block group (referred to as "a fourth block group"). In this manner, the processing time at the receiving end is further shortened.

After decompressing the plurality of block groups, at block 415, the second processing unit 255 generates, based on the plurality of decompressed block groups, a frame for display on the graphics display device 110. Approaches of forming a frame from block groups and displaying the frame is well known in the art and thus will not be detailed here.

Thereby, at the receiving end, the decompression and recombination of the plurality of block groups may be performed at the same processing unit, for example, the second processing unit 255. This further simplifies the processing at the receiving side, improves the system efficiency and reduces the system latency. In particular, in the embodiments where there is a direct data transmission path between the second processing unit 255 and the second wireless network interface 240, the programmable device 105 no longer needs to traverse the kernel/user mode boundary with multiple times of data copying. For example, the second wireless network interface 240 may directly store the plurality of received block groups into the memory of the second processing unit 255 bypass the host memory. In this manner, the length of the data transmission path at the receiving side is further shortened, and the system performance is further improved.

The functions described herein may be at least partly executed by one or more hardware logic components. Illustrative types of usable hardware logical components include, for example, but are not limited to, field-programmable gate array (FPGA), application-specific integrated circuit (ASIC), application-specific standard product (ASSP), system on chip (SOC), complex programmable logic device (CPLD), and the like.

Program codes for carrying out the methods of the subject matter described herein may be written in any combination of one or more programming languages. These computer program codes may be provided to a processor or controller of a general purpose computer, special purpose computer, or other programmable data processing apparatus, such that the program codes, when executed by the processor or controller, cause the functions/operations specified in the flowcharts and/or block diagrams to be implemented. The program code may be executed entirely on a machine, partly on the machine, as a stand-alone software package, partly on the machine and partly on a remote machine or entirely on the remote machine or server.

In the context of the subject matter described herein, a machine readable medium may be any tangible medium that may contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter described herein. Certain features that are described in the context of separate implementations may also be combined in a single implementation. Conversely, the various features that are described in the context of a single implementation may also be implemented in a plurality of implementations separately or in any suitable sub-combination.

Listed below are some example implementations of the subject matter described herein.

In one aspect, there is provided a method implemented at a first processing unit in a computing device for a media processing system. The method comprises: generating a frame to be displayed based on a graphics content for an application running on the computing device; dividing the frame to be displayed into a plurality of block groups; compressing the plurality of block groups; and sending the plurality of compressed block groups to a graphics display device in the media processing system over a wireless link.

In some implementations, the first processing unit comprises a plurality of cores, generating the frame to be displayed comprises generating the frame to be displayed based on the graphics content by using a first set of cores among the plurality of cores, and compressing the plurality of block groups comprises compressing the plurality of block groups by using a second set of cores among the plurality of cores, the second set of cores being different from the first set of cores.

In some implementations, the graphics content is a first graphics content, the frame to be displayed is a first frame to be displayed, and the method further comprises: in parallel with compressing the plurality of block groups by using the second set of cores, generating a second frame to be displayed based on a second graphics content for the application by using the first set of cores, the second graphics content being different from the first graphics content, the second frame being different from the first frame.

In some implementations, sending the plurality of compressed block groups to the graphics display device comprises: in parallel with compressing the plurality of block groups, sending the plurality of compressed block groups to the graphics display device over the wireless link.

In some implementations, the first processing unit executes a plurality of threads, compressing the plurality of block groups comprises compressing a first block group among the plurality of block groups by using a first thread among the plurality of threads, and sending the plurality of compressed block groups comprises sending the first compressed block group to the graphics display device over the wireless link by using a second thread among the plurality of threads the second thread being different from the first thread.

In some embodiment, the method further comprises: in parallel with sending the first compressed block group by using the second thread, compressing a second block group 20) among the plurality of block groups by using the first thread, the second block group being different from the first block group.

In some implementations, the first processing unit is coupled to a first wireless network interface unit in the computing device, and sending the plurality of compressed block groups comprises sending the plurality of compressed block groups to the graphics display device via the first wireless network interface unit over the wireless link.

In some implementations, the method further comprises: in parallel with sending one block group by using the second thread, compressing another block group among the plurality of block groups by using the first thread.

In some implementations, the first processing unit comprises at least one of a graphics processing unit, a field-programmable gate array and an application-specific integrated circuit.

In one aspect, there is provided a method implemented at a second processing unit in a programmable device in a media processing system, the programmable device being coupled to a graphics display device. The method comprises: receiving a plurality of compressed block groups from a computing device over a wireless link, the plurality of compressed block groups being generated based on a graphics content for an application running on the computing device; decompressing the plurality of received block groups; and generating, based on the plurality of decompressed block groups, a frame for display on the graphics display device.

In some implementations, decompressing the plurality of block groups comprises: decompressing the plurality of block groups in parallel with receiving the plurality of block groups.

In some implementations, the second processing unit executes a plurality of threads; receiving the plurality of block groups comprises receiving a third block group among the a plurality of block groups from the computing device over the wireless link by using a third thread among the plurality of threads; decompressing the plurality of block groups comprises decompressing the third received block group by using a fourth thread among the plurality of threads, the fourth thread being different from the third thread.

In some implementations, the method further comprises: in parallel with decompressing the third received block group by using the fourth thread, receiving a fourth block group among the plurality of block groups from the computing device over the wireless link by using the third thread, the fourth block group being different from the third block group.

In some implementations, the method further comprises: while decompressing a received block group by using the fourth thread, receiving a further block group among the plurality of block groups from the computing device over the wireless link by using the third thread.

In some implementations, the second processing unit is coupled to a second wireless network interface unit in the programmable device, and receiving the plurality of block groups comprises receiving the plurality of block groups from the computing device via the second wireless network interface unit over the wireless link.

In some implementations, the second processing unit comprises at least one of a graphics processing unit, a field-programmable gate array and an application-specific integrated circuit.

In one aspect, there is provided a computing device for a media processing system. The computing device comprises: a processing unit; and a memory coupled to the processing unit and storing instructions which, when executed by the processing unit, perform compression processing of graphics contents, including acts comprising: generating a frame to be displayed based on a graphics content for an application running on the computing device; dividing the frame to be displayed into a plurality of block groups; compressing the plurality of block groups; and sending the plurality of compressed block groups to a graphics display device in the media processing system over a wireless link.

In some implementations, the first processing unit comprises a plurality of cores, generating the frame to be displayed comprises generating the frame to be displayed based on the graphics content by using a first set of cores among the plurality of cores; compressing the plurality of block groups comprises compressing the plurality of block groups by using a second set of cores among the plurality of cores, the second set of cores being different from the first set of cores.

In some implementations, the graphics content is a first graphics content, the frame to be displayed is a first frame to be displayed, and the acts further comprise: in parallel with compress the plurality of block groups by using the second set of cores, generating a second frame to be displayed based on a second graphics content for the application by using the first set of cores, the second graphics content being different from the first graphics content, the second frame being different from the first frame.

In some implementations, sending the plurality of compressed block groups to the graphics display device comprises: in parallel with compressing the plurality of block groups, sending the plurality of compressed block groups to the graphics display device over the wireless link.

In some implementations, the first processing unit executes a plurality of threads, compressing the plurality of block groups comprises compressing a first block group among the plurality of block groups by using a first thread among the plurality of threads; sending the plurality of compressed block groups comprises sending the first compressed block group to the graphics display device over the wireless link by using a second thread among the plurality of threads, the second thread being different from the first thread.

In some embodiment, the acts further comprise: in parallel with sending the compressed first block group by using the second thread, compressing a second block group among the plurality of block groups by using the first thread, the second block group being different from the first block group.

In some implementations, the first processing unit is coupled to a first wireless network interface unit in the computing device, and sending the plurality of compressed block groups comprises sending the plurality of compressed block groups to the graphics display device via the first wireless network interface unit over the wireless link.

In some implementations, the first processing unit comprises at least one of a graphics processing unit, a field-programmable gate array and an application-specific integrated circuit.

In one aspect, there is provided a programmable device in a media processing system. The programmable device comprises: a processing unit; and a memory coupled to the processing unit and storing instructions which, when executed by the processing unit, perform decompression processing of graphics contents, including acts comprising: receiving a plurality of compressed block groups from a computing device over a wireless link, the plurality of compressed block groups being generated based on a graphics content for an application running on the computing device; decompressing the plurality of received block groups; and generating, based on the plurality of decompressed block groups, a frame for display on a graphics display device.

In some implementations, decompressing the plurality of block groups comprises: decompressing the plurality of block groups in parallel with receiving the plurality of block groups.

In some implementations, the second processing unit executes a plurality of threads; receiving the plurality of block groups comprises receiving a third block group among the plurality of block groups from the computing device over the wireless link by using a third thread among the plurality of threads; decompressing the plurality of block groups comprises decompressing the third received block group by using a fourth thread among the plurality of threads, the fourth thread being different from the third thread.

In some implementations, the acts further comprise: in parallel with decompressing the third received block group by using the fourth thread, receiving a fourth block group among the plurality of block groups from the computing device over the wireless link by using the third thread, the fourth block group being different from the third block group.

In some implementations, the second processing unit is coupled to a second wireless network interface unit in the programmable device, and receiving the plurality of block groups comprises receiving the plurality of block groups from the computing device via the second wireless network interface unit over the wireless link.

In some implementations, the second processing unit comprises at least one of a graphics processing unit, a field-programmable gate array and an application-specific integrated circuit.

In one aspect, there is provided a machine readable storage medium storing machine executable instructions therein, the machine executable instructions, when running on a device, causing the device to perform compression processing of graphics contents, including acts comprising: generating a frame to be displayed based on a graphics content for an application running on the computing device; dividing the frame to be displayed into a plurality of block groups; compressing the plurality of block groups; and sending the plurality of compressed block groups to a graphics display device in the media processing system over a wireless link.

In some implementations, the first processing unit comprises a plurality of cores; generating the frame to be displayed comprises generating the frame to be displayed based on the graphics content by using a first set of cores among the plurality of cores; compressing the plurality of block groups comprises compressing the plurality of block groups by using a second set of cores among the plurality of cores, the second set of cores being different from the first set of cores.

In some implementations, the graphics content is a first graphics content, the frame to be displayed is a first frame to be displayed, and the acts further comprise: in parallel with compressing the plurality of block groups by using the second set of cores, generating a second frame to be displayed based on a second graphics content for the application by using the first set of cores, the second graphics content being different from the first graphics content, the second frame being different from the first frame.

In some implementations, sending the plurality of compressed block groups to the graphics display device comprises: in parallel with compressing the plurality of block groups, sending the plurality of compressed block groups to the graphics display device over the wireless link.

In some implementations, the first processing unit executes a plurality of threads, compressing the plurality of block groups comprises compressing a first block group among the plurality of block groups by using a first thread among the plurality of threads; sending the plurality of compressed block groups comprises sending the first compressed block group to the graphics display device over the wireless link by using a second thread among the plurality of threads, the second thread being different from the first thread.

In some embodiment, the acts further comprise: in parallel with sending the first compressed block group by using the second thread, compressing a second block group among the plurality of block groups by using the first thread, the second block group being different from the first block group.

In some implementations, the first processing unit is coupled to a first wireless network interface unit in the computing device, and sending the plurality of compressed block groups comprises sending the plurality of compressed block groups to the graphics display device via the first wireless network interface unit over the wireless link.

In some implementations, the first processing unit comprises at least one of a graphics processing unit, a field-programmable gate array and an application-specific integrated circuit.

In one aspect, there is provided a machine readable storage medium storing machine executable instructions therein, the machine executable instructions, when running on a device, causing the device to perform decompression processing of graphics contents, including acts comprising: receiving a plurality of compressed block groups from a computing device over a wireless link, the plurality of compressed block groups being generated based on a graphics content for an application running on the computing device; decompressing the plurality of received block groups; and generating, based on the plurality of decompressed block groups, a frame for display on a graphics display device.

In some implementations, decompressing the plurality of block groups comprises: decompressing the plurality of block groups in parallel with receiving the plurality of block groups.

In some implementations, the second processing unit executes a plurality of threads, receiving the plurality of block groups comprises receiving a third block group among the plurality of block groups from the computing device over the wireless link by using a third thread among the plurality of threads, and decompressing the plurality of block groups comprises decompressing the third received block group by using a fourth thread among the plurality of threads, the fourth thread being different from the third thread.

In some implementations, the acts further comprise: in parallel with decompressing the third received block group by using the fourth thread, receiving a fourth block group among the plurality of block groups from the computing device over the wireless link by using the third thread, the fourth block group being different from the third block group.

In some implementations, the second processing unit is coupled to a second wireless network interface unit in the programmable device, and receiving the plurality of block groups comprises receiving the plurality of block groups from the computing device via the second wireless network interface unit over the wireless link.

In some implementations, the second processing unit comprises at least one of a graphics processing unit, a field-programmable gate array and an application-specific integrated circuit.

Although the subject matter described herein has been described in a language specific to structural features and/or methodologic acts, it should be appreciated that the subject matter as defined in the appended claims is not limited to the specific features or acts described above. On the contrary, the specific features and acts described above are merely example forms for implementing the claims.

The invention claimed is:

1. A computing device, comprising:
at least one processor; and
memory comprising instructions that, when executed by the at least one processor, cause the at least one processor to perform operations to:
generate a frame to be displayed on a graphics display based on a graphics content for an application running on the computing device using a first set of cores of the at least one processor;
divide the frame to be displayed into a plurality of block groups;
compress the plurality of block groups concurrently with generation of the frame, using a first set of processing threads of a plurality of processing threads of a second set of cores of the at least one processor to generate a plurality of compressed block groups; and
in parallel with compression of the plurality of block groups, transmit the plurality of compressed block groups to a device using a second set of processing threads of the plurality of processing threads of the second set of cores, the second set of processing threads being different than the first set of processing threads.

2. The computing device of claim 1, the instructions to generate the frame to be displayed further comprising instructions to generate the frame to be displayed based on the graphics content by using a first set of cores among a plurality of cores, and the instructions to compress the plurality of block groups further comprising instructions to compress the plurality of block groups by using a second set of cores among the plurality of cores, the second set of cores being different from the first set of cores.

3. The computing device according to claim 2, wherein the graphics content is a first graphics content and the frame is a first frame, and the memory further comprising instructions that, when executed by the at least one processor, cause the at least one processor to perform operations to:
in parallel with compression of the plurality of block groups by using the second set of cores, generate a second frame to be displayed based on a second graphics content for the application by using the first set of cores, the second graphics content being different from the first graphics content, the second frame being different from the first frame.

4. The computing device according to claim 2, wherein the plurality of compressed block groups are transmitted via a direct link established between memory coupled to the at least one processor and a network interface card bypassing host memory.

5. The computing device according to claim 1, the instructions to compress the plurality of block groups further comprising instructions to compress a first block group among the plurality of block groups by using a first thread among the plurality of processing threads to generate a first compressed block group, and the instructions to transmit the plurality of compressed block groups further comprising instructions to transmit the first compressed block group to a device over a wireless link by using a second thread among the plurality of processing threads, the second thread being different from the first thread.

6. The computing device according to claim 5, the memory further comprising instructions that, when executed by the at least one processor, causes the at least one processor to perform operations to:
in parallel with transmission of the first compressed block group by using the second thread, compress a second block group among the plurality of block groups by using the first thread, the second block group being different from the first block group.

7. The computing device according to claim 1, the memory further comprising instructions that, when executed by the at least one processor, cause the at least one processor to perform operations to:
establish a set of parallel processing pipelines for compression of the plurality of block groups, the instructions to compress the plurality of block groups further comprising instructions to distribute block groups of the plurality of block groups among the set of parallel processing pipelines to compress the block groups in parallel.

8. At least one non-transitory machine-readable medium storing instructions that, when executed by at least one processor, cause the at least one processor to perform operations to:
generate a frame to be displayed on a graphics display based on a graphics content for an application running on a computing device using a first set of cores of the at least one processor;
divide the frame to be displayed into a plurality of block groups;
compress the plurality of block groups concurrently with generation of the frame, using a first set of processing threads of a plurality of processing threads of a second set of cores of the at least one processor to generate a plurality of compressed block groups; and
in parallel with compression of the plurality of block groups, transmit the plurality of compressed block groups to a device using a second set of processing threads of the plurality of processing threads of the second set of cores, the second set of processing threads being different than the first set of processing threads.

9. The at least one non-transitory machine-readable medium of claim 8, the instructions to generate the frame to be displayed further comprising instructions to generate the frame to be displayed based on the graphics content by using a first set of cores among a plurality of cores, and the instructions to compress the plurality of block groups further comprising instructions to compress the plurality of block groups by using a second set of cores among the plurality of cores, the second set of cores being different from the first set of cores.

10. The at least one non-transitory machine-readable medium of claim 9, wherein the graphics content is a first graphics content and the frame is a first frame, and further comprising instructions that, when executed by the at least one processor, cause the at least one processor to perform operations to:
in parallel with compression of the plurality of block groups by using the second set of cores, generate a second frame to be displayed based on a second graphics content for the application by using the first set of cores, the second graphics content being different from the first graphics content, the second frame being different from the first frame.

11. The at least one non-transitory machine-readable medium of claim 8, wherein the plurality of compressed block groups are transmitted via a direct link established between memory coupled to the at least one processor and a network interface card bypassing host memory.

12. The at least one non-transitory machine-readable medium of claim 8, the instructions to compress the plurality of block groups further comprising instructions to compress a first block group among the plurality of block groups by using a first thread among the plurality of processing threads to generate a first compressed block group, and the instructions to transmit the plurality of compressed block groups further comprising instructions to transmit the first compressed block group to a device over a wireless link by using a second thread among the plurality of processing threads, the second thread being different from the first thread.

13. The at least one non-transitory machine-readable medium of claim 12, further comprising instructions that, when executed by the at least one processor, causes the at least one processor to perform operations to:
in parallel with transmission of the first compressed block group by using the second thread, compress a second block group among the plurality of block groups by using the first thread, the second block group being different from the first block group.

14. The at least one non-transitory machine-readable medium of claim 8, further comprising instructions that, when executed by the at least one processor, cause the at least one processor to perform operations to:
establish a set of parallel processing pipelines for compression of the plurality of block groups, the instructions to compress the plurality of block groups further comprising instructions to distribute block groups of the plurality of block groups among the set of parallel processing pipelines to compress the block groups in parallel.

15. A method, comprising:
generating a frame to be displayed on a graphics display based on a graphics content for an application running on a computing device using a first set of cores of the at least one processor,
dividing the frame to be displayed into a plurality of block groups;
compressing the plurality of block groups concurrently with generation of the frame, using a first set of processing threads of a plurality of processing threads of a second set of cores of the at least one processor to generate a plurality of compressed block groups; and
in parallel with compression of the plurality of block groups, transmitting the plurality of compressed block groups to a device using a second set of processing threads of the plurality of processing threads of the second set of cores, the second set of processing threads being different than the first set of processing threads.

16. The method of claim 15, wherein generating the frame to be displayed comprises generating the frame to be displayed based on the graphics content by using a first set of cores among a plurality of cores, and wherein compressing the plurality of block groups comprises compressing the plurality of block groups by using a second set of cores among the plurality of cores, the second set of cores being different from the first set of cores.

17. The method of claim 16, wherein the graphics content is a first graphics content and the frame is a first frame, and further comprising:
in parallel with compressing the plurality of block groups by using the second set of cores, generating a second frame to be displayed based on a second graphics content for the application by using the first set of cores, the second graphics content being different from the first graphics content, the second frame being different from the first frame.

18. The method of claim 15, wherein the plurality of compressed block groups are transmitted via a direct link established between memory coupled to at least one processor and a network interface card bypassing host memory.

19. The method of claim 15, wherein compressing the plurality of block groups comprises compressing a first block group among the plurality of block groups by using a first thread among the plurality of processing threads to generate a first compressed block group, and wherein transmitting the plurality of compressed block groups comprises transmitting the first compressed block group to a device over a wireless link by using a second thread among the plurality of processing threads, the second thread being different from the first thread.

20. The method of claim 19, further comprising:
in parallel with transmitting the first compressed block group by using the second thread, compressing a second block group among the plurality of block groups by using the first thread, the second block group being different from the first block group.

* * * * *